United States Patent
Wojnarowski et al.

(10) Patent No.: US 6,407,411 B1
(45) Date of Patent: Jun. 18, 2002

(54) LED LEAD FRAME ASSEMBLY

(75) Inventors: Robert J. Wojnarowski, Ballston Lake; Richard J. Uriarte, Clifton Park, both of NY (US); Ferenc Horkay, Rockville, MD (US); Pamela K. Benicewicz, Loudonville; William P. Minnear, Clifton Park, both of NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/548,440

(22) Filed: Apr. 13, 2000

(51) Int. Cl.[7] .................. H01L 33/00; H01L 23/495
(52) U.S. Cl. .................. 257/99; 257/100; 257/675; 257/676
(58) Field of Search .................. 257/98, 99, 100, 257/675, 676, 778

(56) References Cited

U.S. PATENT DOCUMENTS

| | | | |
|---|---|---|---|
| 3,771,091 A | * 11/1973 | Harnden, Jr. ............. | 338/20 |
| 4,057,825 A | 11/1977 | Narita et al. ............. | 357/81 |
| 4,093,473 A | * 6/1978 | Lindmayer ............. | 136/89 P |
| 4,267,559 A | * 5/1981 | Johnson et al. ............. | 357/81 |
| 4,630,092 A | 12/1986 | Bhagat ............. | 357/38 |
| 4,682,199 A | 7/1987 | Yatsuo et al. ............. | 357/38 |
| 4,792,530 A | 12/1988 | Nilarp ............. | 437/6 |
| 4,849,803 A | * 7/1989 | Yamamoto ............. | 357/72 |
| 5,414,587 A | * 5/1995 | Kiser et al. ............. | 361/118 |
| 5,463,251 A | 10/1995 | Fujita et al. ............. | 257/717 |
| 5,506,451 A | * 4/1996 | Hyugaji ............. | 257/778 |
| 5,865,529 A | * 2/1999 | Yan ............. | 362/327 |
| 5,869,869 A | * 2/1999 | Hively ............. | 257/355 |
| 5,895,932 A | * 4/1999 | Bojarczuk, Jr. et al. .... | 257/103 |
| 5,986,885 A | * 11/1999 | Wyland ............. | 361/704 |
| 6,120,600 A | 9/2000 | Edmond et al. ............. | 117/89 |
| 6,201,696 B1 | 3/2001 | Shimizu et al. ............. | 361/704 |

OTHER PUBLICATIONS

Guha, S., Bojarczuk, N.A., and Haight, R., "Hybrid organic–inorganic GaN LED based color downconversion for displays", in 1997 Digest of the IEEE/LEOS Summer Topical Meetings, ISBN: 0-7803-3891-X, pp. 22-23 (Aug. 11-15, 1997).*

* cited by examiner

Primary Examiner—Nathan Flynn
Assistant Examiner—Johannes Mondt
(74) Attorney, Agent, or Firm—Fay, Sharpe, Fagan, Minnich & McKee, LLP

(57) ABSTRACT

An improved LED lead frame packaging assembly includes a thermally conducting, electrically insulating material that enhances the thermal conduction and structural integrity of the assembly, a UV-resistant encapsulant material, and an integral ESD material that reduces electrostatic discharge. The thermally conducting, electrically insulating material creates an electrically insulating, thermally conductive path in the lead frame assembly for dissipation of power and also acts as a mounting structure thus allowing for the use of a soft encapsulant material, preferably a silicone.

31 Claims, 13 Drawing Sheets

FIG. 1 _PRIOR ART_

LED LEAD FRAME ASSEMBLY

BACKGROUND OF THE INVENTION

1. Field of the Invention

This invention pertains to LED lead frame assemblies. More particularly, the invention relates to an improved LED lead frame structure having a thermally conducting, electrically insulating material that enhances both the thermal conduction and structural integrity of the assembly while allowing for the presence of a UV-resistant soft encapsulated material and an integral ESD device.

2. Discussion of the Art

A standard 5 mm light emitting diode (LED) package generally includes a hard plastic encapsulant material, which supplies a high degree of mechanical stability to the lead frame structure. The encapsulant allows for the manipulation and bending of the lead frame leads for solder configuration.

Various polymers have successfully been used over the years by different manufacturers as the plastic encapsulant, particularly in connection with the packaging of red and green LED products. These polymers are not generally subject to ultraviolet damage such as color centers and color shift. Suitable polymers used in the past include cycloalaphatics, PMMA, epoxies and polyurethanes.

With the invention of white LEDs and the use of gallium nitride material therein, ultraviolet light at 360–420 nanometers presents new obstacles in connection with the packaging of white light LEDs semiconductor products. For example, gallium nitride and other semiconductor materials, such as silicone carbide, emit ultraviolet light, which degrades many of the above-mentioned polymers typically used in the prior art LED assembly processes. Further, electrostatic discharge (ESD), generally associated with the handling of any LED structure including white light LEDs, induces electrical energies that damage or destroy the structures. In addition, higher power devices are presently being developed for the LED industry thereby necessitating packaging that is capable of withstanding the higher power output.

In view of its UV resistance, it is desired to use silicone as an encapsulant material in the assembly package. But the softness of silicone presents structural, mechanical, and assembly problems. More particularly, its softness does not supply a high degree of stability to the conventional LED lead frame assembly package typically used in high volume manufacturing, where lead tie bars are removed.

Thus, there exists a need for improved packaging for an LED lead frame assembly that optimizes the thermal performance of the package, allows for the presence of an encapsulant material that is UV-resistant, includes integral ESD protection, and supplies a high degree of structural and mechanical integrity to the LED lead frame assembly.

BRIEF SUMMARY OF THE INVENTION

A new and improved semiconductor device packaging assembly is provided. Briefly, in accordance with one embodiment of the present invention, the packaging assembly employs a light-emitting semiconductor and input terminals connected to the light-emitting semiconductor for energizing the light-emitting semiconductor to emit light. Thermally conductive material in the assembly forms a thermally conductive path for dissipation of power out of the input terminals when the light-emitting semiconductor is energized.

A principal advantage of the present invention is that an LED lead frame assembly is disclosed that optimizes the thermal and mechanical performance of the package.

Another advantage of the present invention is that a thermally optimized lead frame assembly for LEDs is provided that enables integral ESD protection.

Still another advantage of the present invention is that an LED lead frame assembly is disclosed that provides a mechanical structure, which in turn allows for the use of soft encapsulant materials in the frame assembly.

Still another advantage of the present invention is that thermal performance of an LED lead frame package is optimized by thermal conductive bonding of the leads.

Another advantage of the present invention is that an integral ESD device is disclosed that can be used in connection with both generic semiconductor and capacitor manufacturing and packaging structures.

A further advantage of the present invention is that a low cost assembly structure, which uses a paradigm change, for an improved lead frame packaging assemblies is disclosed.

Another advantage of the present invention is that a method of structural enhancement of a LED package when using a soft encapsulant material such as silicone is disclosed.

Still another advantage of the present invention is that a lead frame assembly structure is disclosed, which can be used in the mass production of LEDs, laser diode devices, and other semiconductor and capacitor technologies.

DETAILED DESCRIPTION OF THE INVENTION

Figure 1:
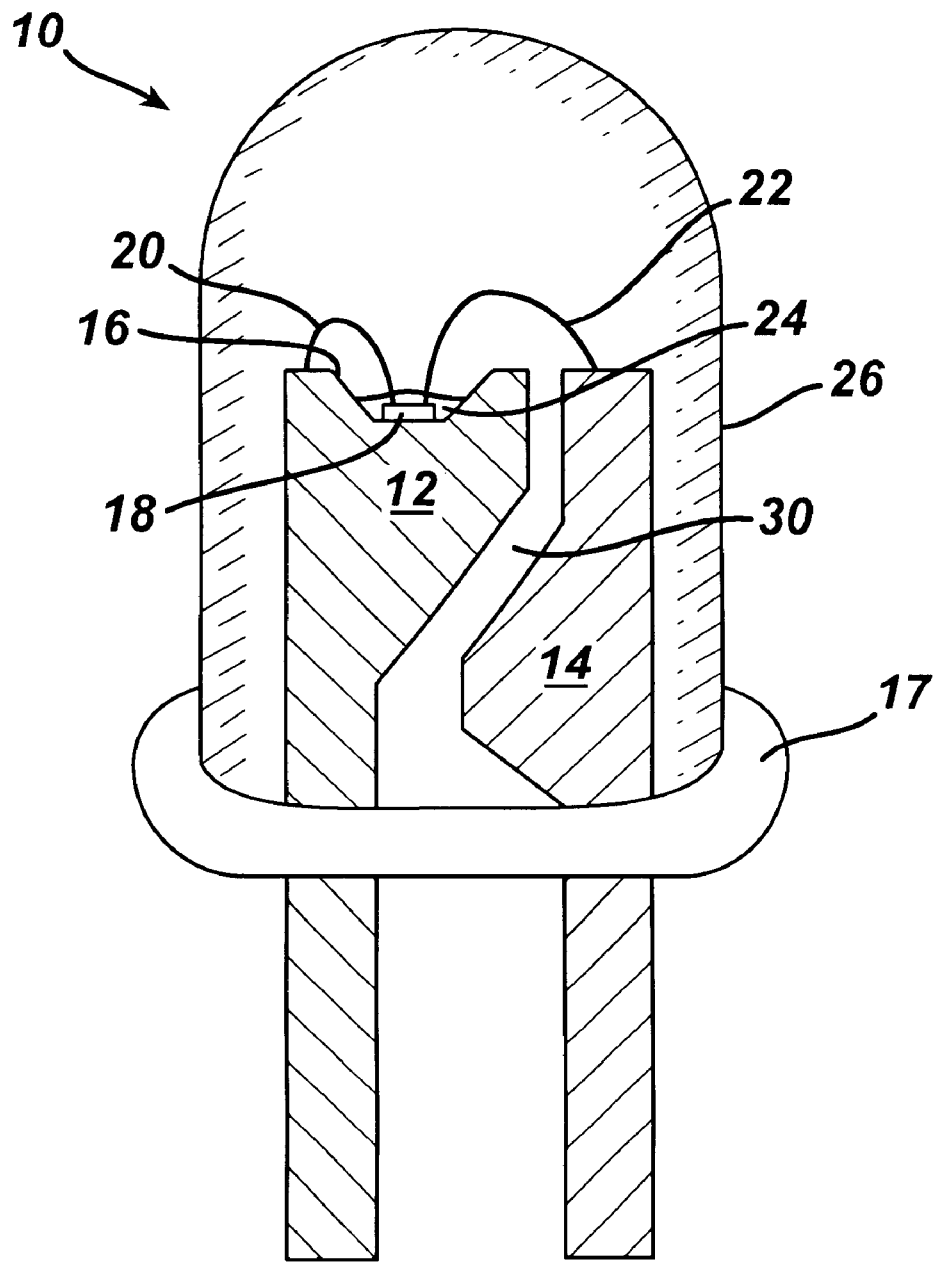
FIG. 1 (PRIOR ART) illustrates a cross-section of a prior art LED lead frame package assembly.
Figure 2:
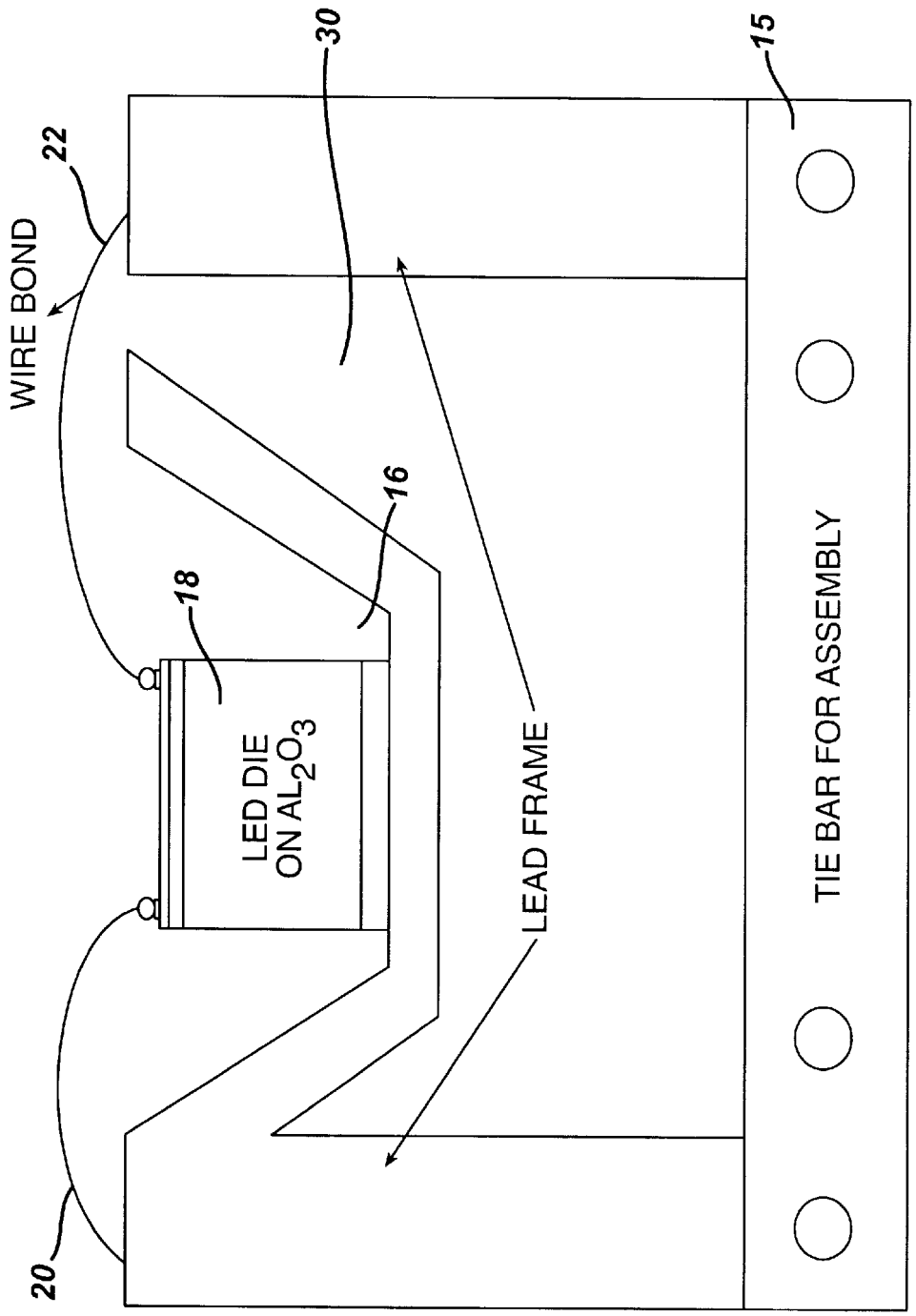
FIG. 2 (PRIOR ART) illustrates a cross-section of a prior art LED lead frame package assembly, including a tie bar.

Referring now to the drawings, which illustrate a preferred embodiment of the invention only and are not intended to limit same, FIGS. 1 and 2 (PRIOR ART) shows a conventional LED lead frame package assembly 10. As is clearly illustrated in FIG. 1, the LED package assembly 10 includes a lead frame having first and second terminals, or die attach lead 12 and isolated lead 14, by which electrical power is supplied to the package assembly 10. The leads 12, 14 are held together during processing by a tie bar structure 15 (shown in FIG. 2) which is cut away after final encapsulation. The die attach lead 12 has a recessed reflector area 16 in which is disposed an LED 18. The LED 18 is connected by a wire bond 20 to the die attach lead 12 and by a wire bond 22 to the isolated lead 14. The LED 18 optionally may include a layer of fluorescent or phosphorescent material 24 disposed over it depending upon the nature of the LED 18. The entire assembly 10 is embedded in a transparent encapsulation epoxy resin 26.

In operation, the LED package assemble 10 of FIG. 1 (PRIOR ART) has power applied to the lead frame at lead frame at 12 or 14, depending on which part of the LED is the p-junction and which part is the n-junction. Thermal modeling of the prior art LED package assemble of FIG. 1 illustrates that the die attach lead 12 is the primary thermal sinking means.

The package assembly 10 additionally includes a thermal gap 30 designed into the LED lead frame assembly 10 that electrically separates the interconnect wire bond areas. The consequence of this electrical separation is an intrinsic thermal bias that causes the heat to track on the die attach lead 12 preferentially over the isolated lead 14. This results in poor thermal optimization, particularly with the higher power devices used in connection with current technology. By optimizing the thermal cooling path, as demonstrated in FIG. 3, it is possible to extract higher power out of the prior art LED package assembly 10.

Figure 3:
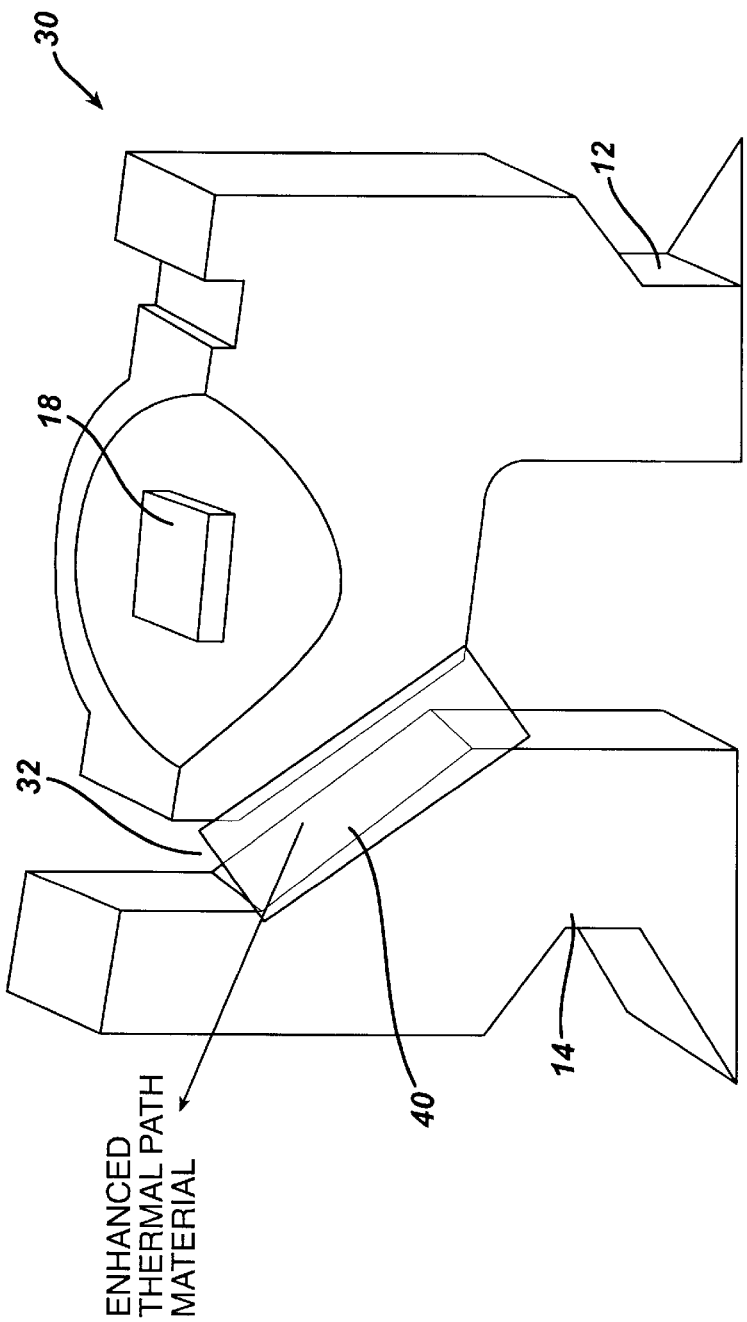
FIG. 3 illustrates a cross-section of the LED lead frame package assembly of the present invention.

In the LED lead frame package assembly 30 of FIG. 3, an electrically insulating but thermally conductive path is created in the lead frame package assembly of FIG. 1 (PRIOR ART) by use of a thermally conductive material 40. The material 40 may be positioned in or, in the alternative, may encase the thermal gap 32 or create a bridge in the gap 32. The present invention contemplates that the thermally conductive material 40 may be used in connection with the LED lead frame package assembly 30 in a number of ways to create an electrically insulating but thermally conductive path. All are considered to be within the scope of this invention. The path greatly increases the thermal conduction of the package by using both leads 12, 14 to remove heat generated by the LED device. The thermally conducting, electrically insulating material 40 may be injection, or transfer molded and is preferably Plaskon SMT-B-1, a product of Amoco Electronic Materials (Plaskon Division), which is a highly-filled fast curing epoxide having good thermal and electrical insulation properties. Many other companies, including Dexter Hysol, make similar materials. In the preferred embodiment, the thermally conducting, electrically insulating material 40 is added in the largest amount possible that will not alter fixed dimensions of the packaging. Further, the thermally conducting, electrically insulating material 40 should not cover the LED 18 or any area that the LED 18 radiates from.

Figure 9A:
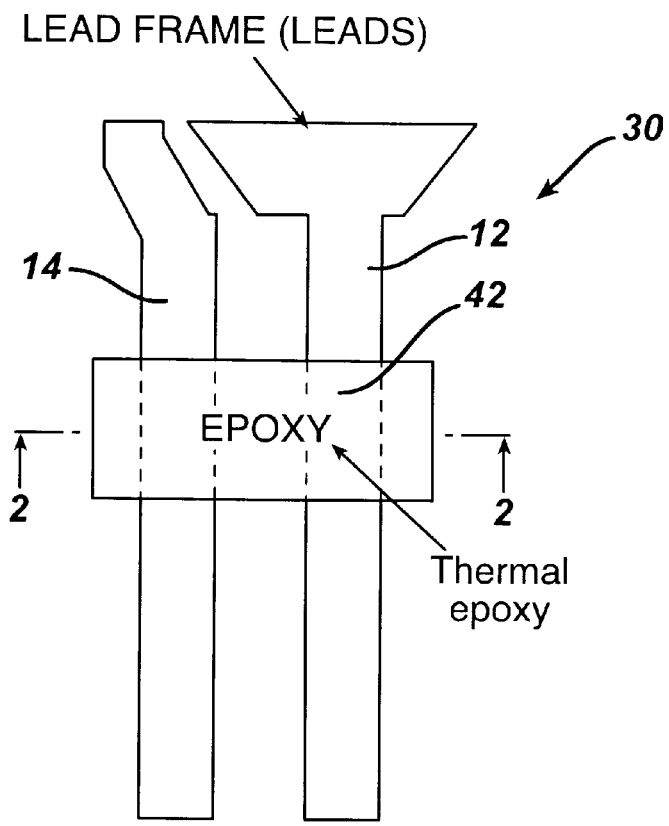
FIGS. 9A–9B illustrate an alternate process for adding the thermal molding mechanical support ring to the packaging assembly.
Figure 9B:
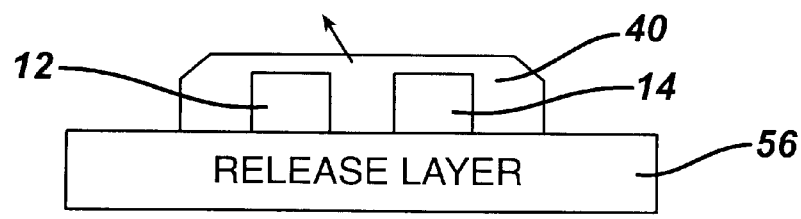

In the alternative, a highly thermally conductive epoxy may be applied by machine in a dot-like format and heat cured, thereby eliminating the need for a molding process. This process is preferred in a retrofit application and is illustrated in FIGS. 9A and 9B. In the retrofit application, the preferred thermally conductive epoxy blend is P280 made by Bacon Industries, Inc.

Other suitable thermally conducting, electrically insulating materials 40 include glass, silicone, SiC, mineral substances, anodizing, oxidized metals such as oxides of tungsten and oxides of molybdenum, crystalline materials such as silicone, epoxy matrix, resistive materials such as RH, semiconductor devices, diamond or diamond matrix, ESD materials with good thermal properties, or Z-axis thermal material. These embodiments may be planer or may be 3-D to increase the area thermal path, and may be used with or without glue as is known and appreciated by those skilled in the art.

Figure 4:
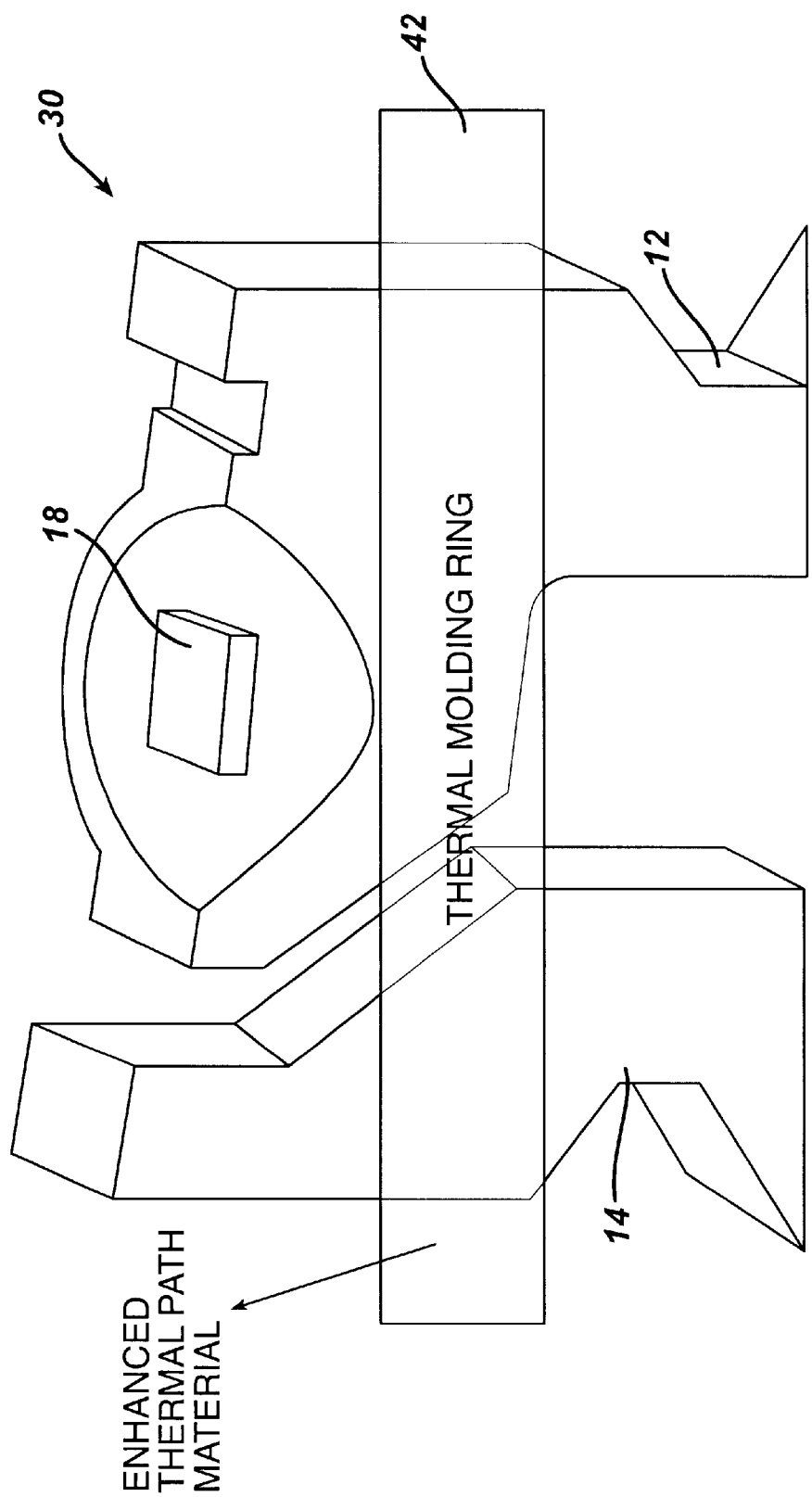
FIG. 4 illustrates the lead frame package assembly of FIG. 3, including a thermal molding mechanical support ring.

In the embodiment of FIG. 4, a thermal molding mechanical support ring 42 is shown in connection with the lead frame package assembly 30. As illustrated in FIG. 1, the prior art 5 mm LED lamps are typically held in place using a similar support ring 17 that serves as a mechanical stop. But contrary to the prior art support ring 17, the support ring 42 of the present invention is formed of thermally conducting, electrically insulating material 40 and thus also removes heat generated by the LED device. The ring 42 may be used alone or in combination with the thermally conducting, electrically insulating path created in FIG. 3 to remove heat. In addition to its function as a heat sink, the support ring 42 is designed so that it also serves as a mounting structure thus allowing for the use of a soft encapsulant material in the LED package assembly 30.

Figure 8A:
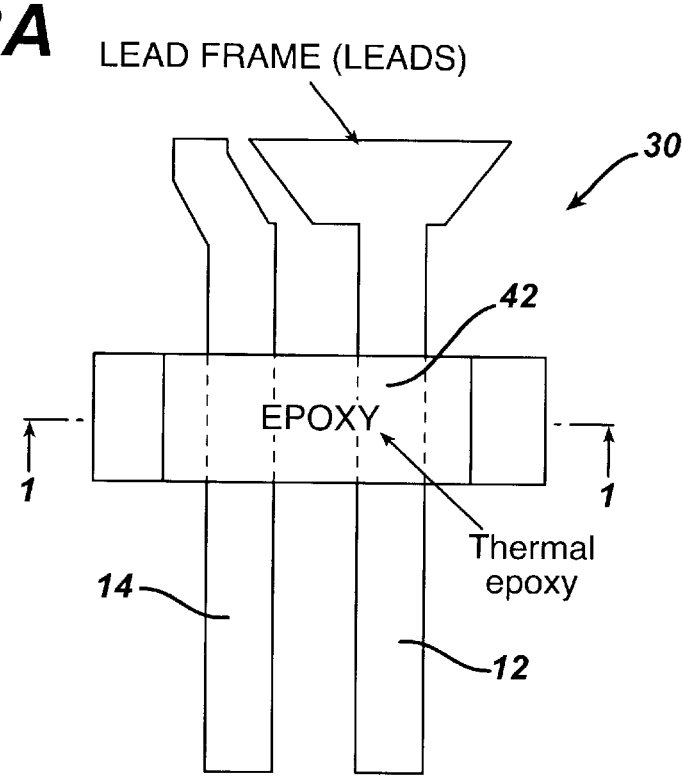
FIGS. 8A–8D illustrate a first process for adding the thermal molding mechanical support ring to the packaging assembly.
Figure 8B:
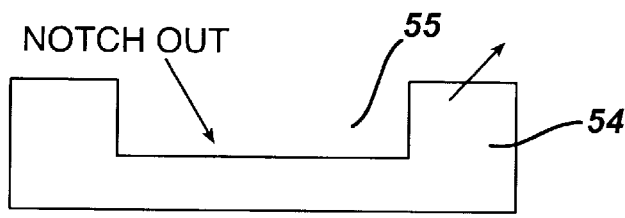
Figure 8C:
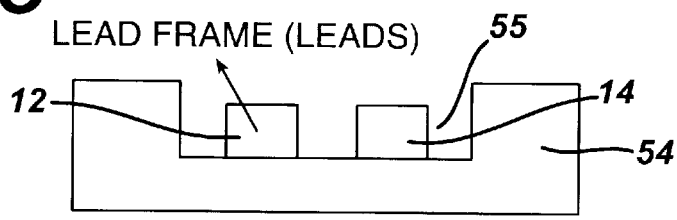
Figure 8D:
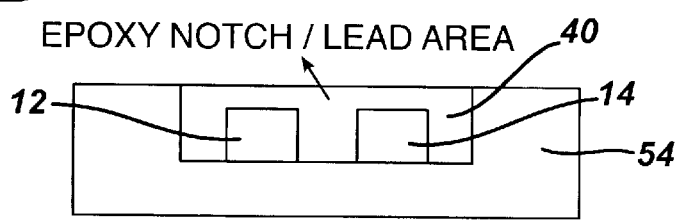

FIGS. 8A–8D and 9A–9B illustrate alternate processes for the addition of the thermal molding mechanical support ring 42 to the packaging assembly 30. Referring to FIG. 8A, a cross-sectional view of the lead frame package assembly with attached support ring 42, leads 12, 14 are positioned in a notched high thermal material frame 54 filled with a thermally conducting, electrically insulating material 40, preferably a thermal epoxy, to form the thermal molding mechanical support ring 42. FIG. 8B is a top plan view of the notched high thermal material frame 54 of FIG. 8A taken along line 1—1. The leads 12, 14 are positioned in the notch area 55 of the frame 54 as best illustrated in FIG. 8C, a top plan view of FIG. 8A taken along line 1—1, prior to filling of the notch area 55 with a thermally conducting, electrically insulating material 40. As shown in FIG. 8D, a top plan view of FIG. 8A taken along line 1—1, the notch area 55 is then filled with a thermally conducting, electrically insulating material 40.

FIG. 9A illustrates a cross-sectional view of an assembly 30 formed with a support ring 42 using an alternate process. With reference to FIG. 9B, a top plan view of the assembly 30 of FIG. 9A taken along lines 2—2, the thermally conducting, electrically insulating material 40, preferably an epoxy, is applied over the lead frame leads 12, 14 which are positioned against a release layer 56. The release layer 56 is used to set the epoxy and is later removed.

Figure 5:
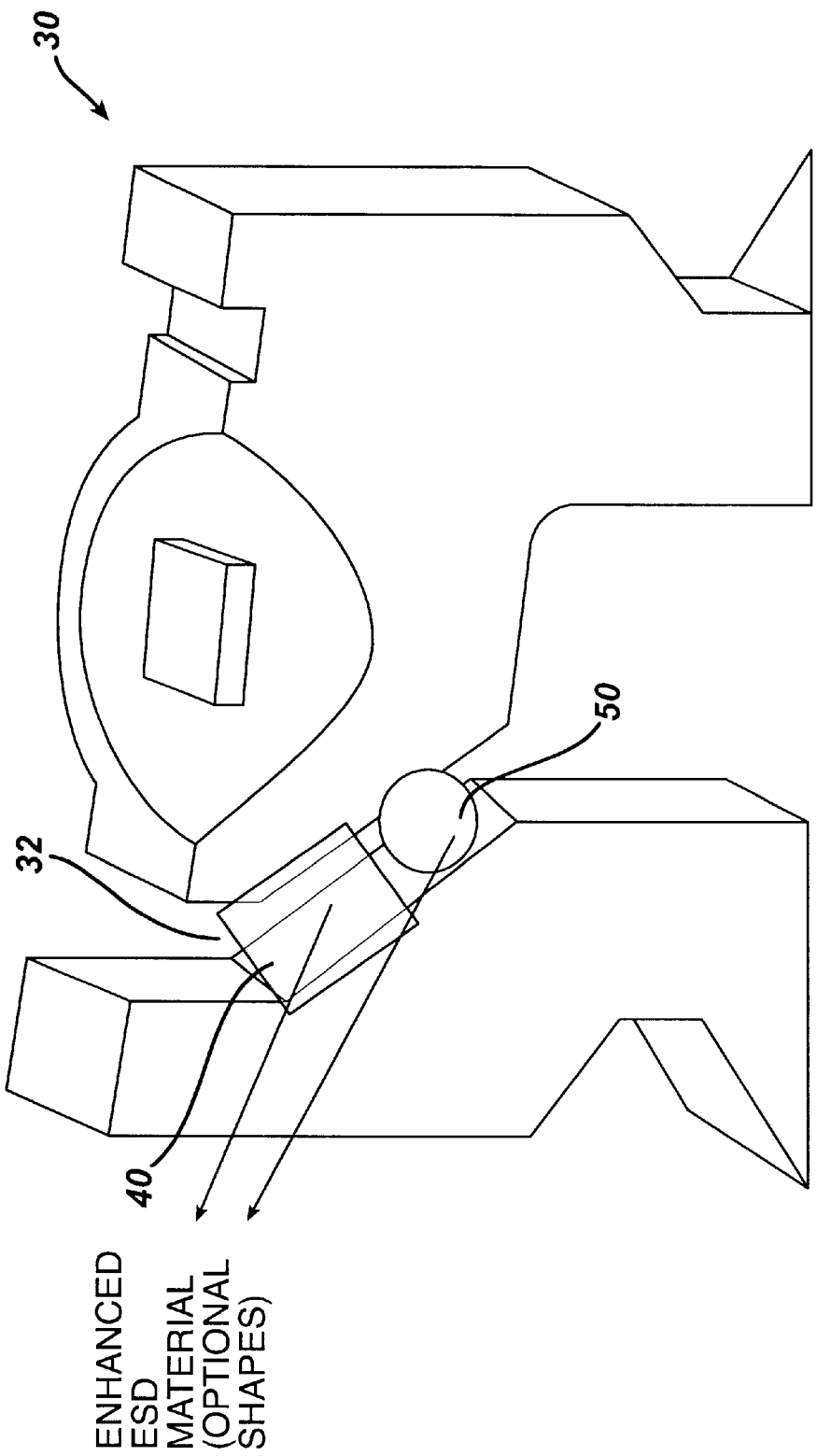
FIG. 5 illustrates a cross-section of the lead frame package assembly of the present invention, including ESD material.

FIG. 5 includes an ESD material 50 inserted in or bridging the thermal gap 32. The ESD material 50 is inserted in a pre-shaped format in any optional shape. The ESD material 50 may function as a thermal enhancement material in addition to an electrostatic discharge material. The preferred ESD material 50 is a MOV material manufactured by Harris Semiconductor and many other companies. The MOV material is designed to provide adequate voltage discharge protection depending upon the application.

Figure 6:
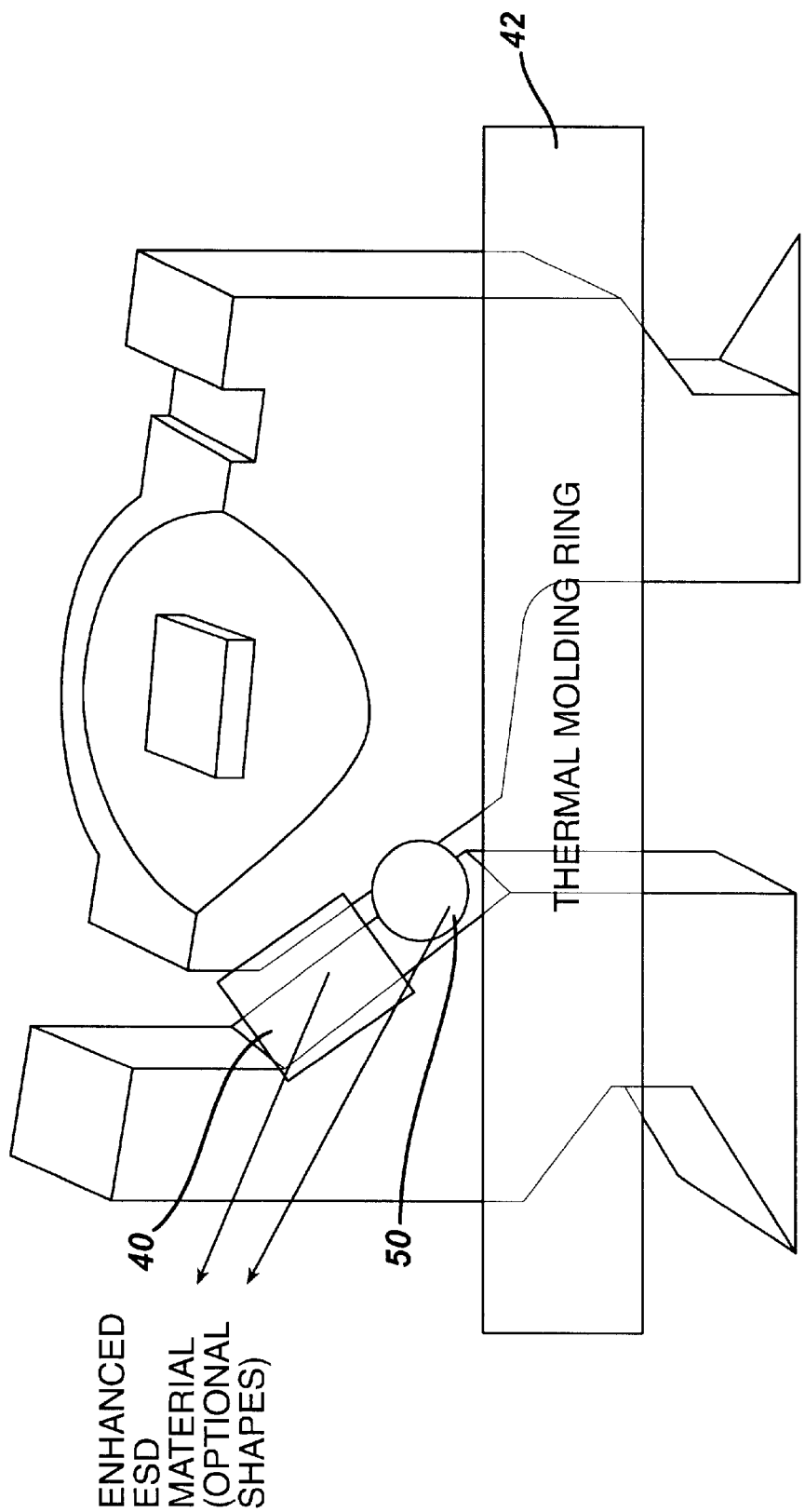
FIG. 6 illustrates the LED lead frame package assembly of FIGS. 4–5.

FIG. 6 illustrates the lead frame package assembly 30 of the present invention, including ESD material 50, thermally conducting, electrically insulating material 40 creating a thermally conductive path, and thermal molded support ring 42 for mounting and additional power dissipation.

Figure 7:
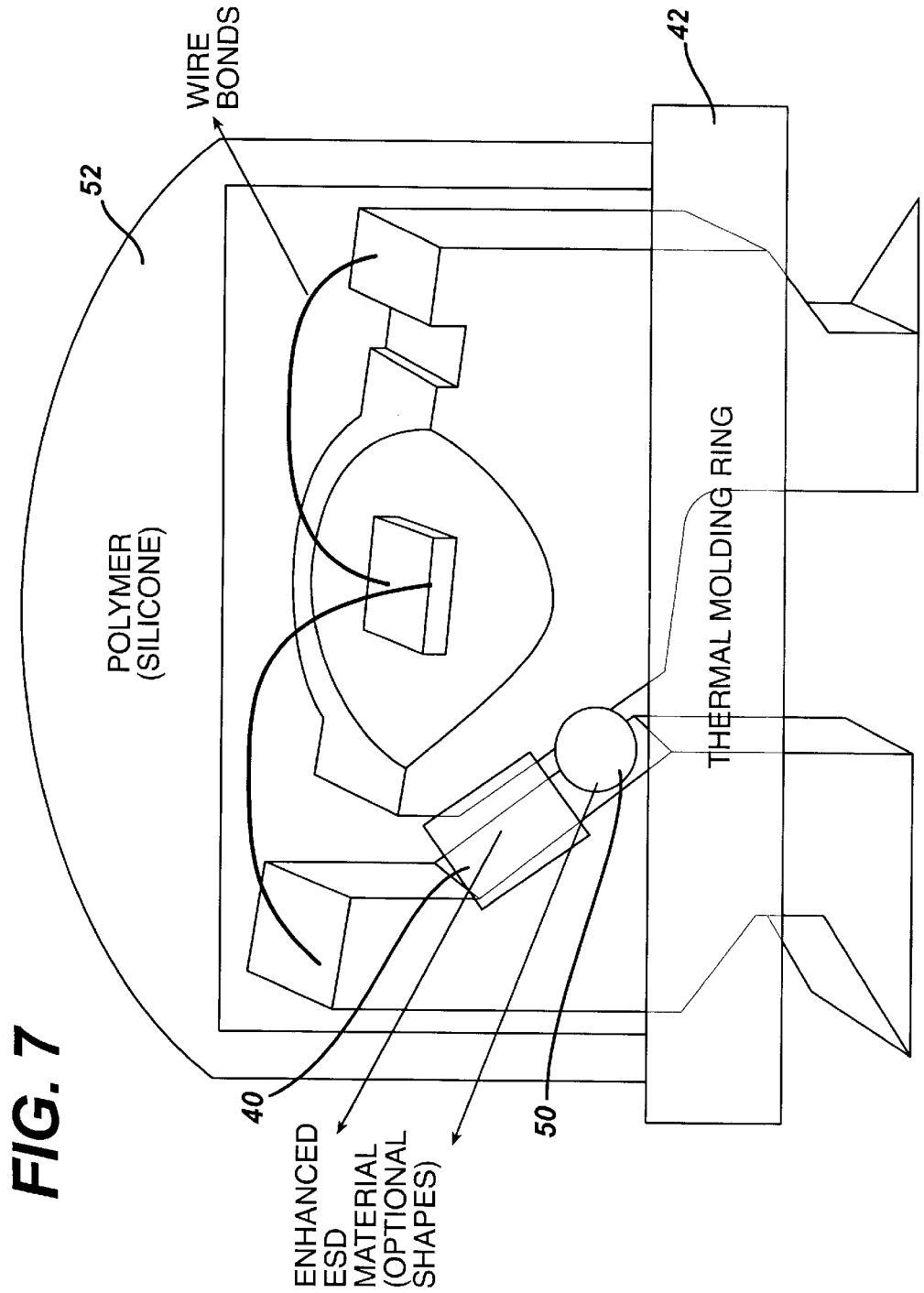
FIG. 7 illustrates the LED lead frame package assembly of FIG. 6, including encapsulation with a polymer.

FIG. 7 shows the embodiment of FIG. 6, encapsulated with a soft material 52, preferably silicone in a range of 20–80 durometers, more preferably 50 durometers. Preferably, the silicone is a crosslinked silicone polymer, e.g., polydimethylsiloxane or any other UV-resistant silicone polymers and copolymers. The silicone may be of many varieties made by General Electric of Waterford, N.Y. and many others, including Dow Corning.

Figure 10:
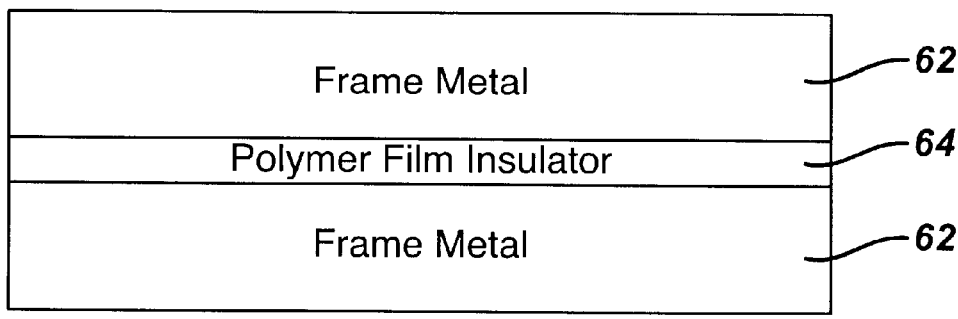
FIG. 10 illustrates a top plan view of a multi-layer flip chip frame structure, including a polymer film insulator layer.

FIG. 10 illustrates a top view of a multi-layer flip chip frame structure 60, including two layers of frame metal 62 and a polymer film insulator layer 64 formed of an epoxy structure that once cured cannot be melted. Suitable examples of the polymer film insulator layer 64 include, for example, KAPTON, a registered trademark of DuPont. The frame metal 62 varies greatly in thickness depending upon the application used. The layers making up frame metal 62 and polymer film insulator layer 64 may be pre-formed and then laminated or glued using any method known by those skilled in the art. The insulating layer 64 can subsequently be patterned by chemical etching, laser patterning by ablation, or plasma or reactive ion etching (RIE). In the alternative, the frame structure 60 may be formed in panels or rolled layers and chemically etched or electro-etched. The insulating layer 64 would subsequently be patterned using any of the methods previously noted.

Figure 11:
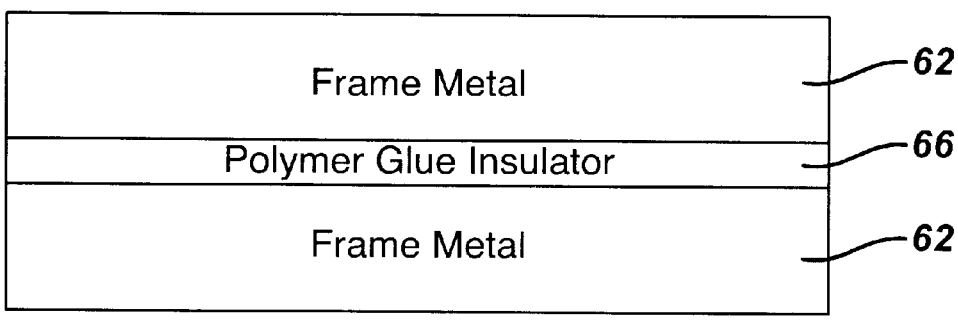
FIG. 11 illustrates a top plan view of a multi-layer flip chip frame structure, including a polymer glue insulator layer.
Figure 12:
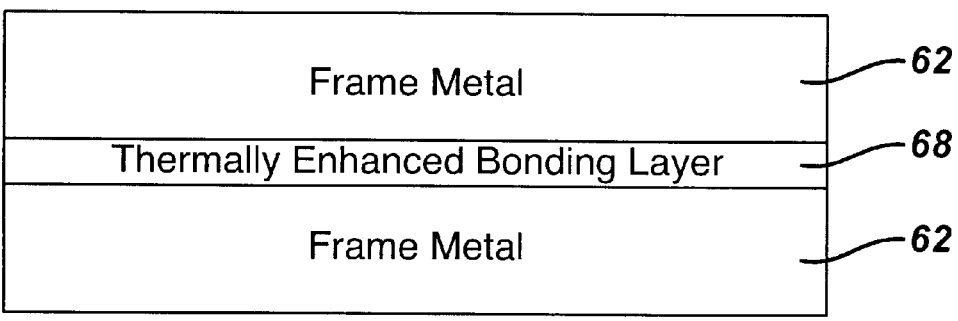
FIG. 12 illustrates a top plan view of a multi-layer flip chip frame structure, including a thermally enhanced bonding layer.

FIG. 11 illustrates a top view of the multi-layer flip chip frame structure 60 of FIG. 10, with the exception that a polymer glue insulator layer 66 is used in place of the polymer film insulator layer 64. The glue insulator layer 66 can be dissolved with a solvent and is of the type manufactured by Ulton of Pittsfield, Mass., or ULTEM, a trademark of General Electric. In the top view of a multi-layer flip chip frame structure shown in FIG. 12, a thermally enhanced bonding layer 68 is substituted for the insulator layers 64, 66 of FIGS. 10 and 11. The thermally enhanced bonding layer 68 preferably includes diamond in an amount sufficient to allow for thermal conductivity across the boundary.

Polymer film insulator layer 64, polymer glue insulator layer 66, and thermally enhanced bonding layer 68 create an insulating, thermally conductive path in the flip chip frame structure 60. The path greatly increases the thermal conduction of the flip chip frame structure 60 by using the frame metal 62 to remove heat generated by any attached LED flip chip structure.

Figure 13:
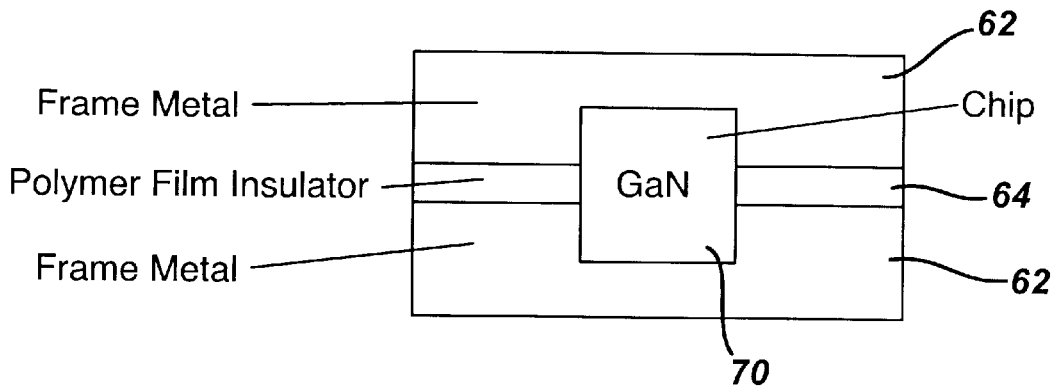
FIG. 13 illustrates a top plan view of a multi-layer flip chip frame structure of FIG. 10, including an attached flip chip.
Figure 14:
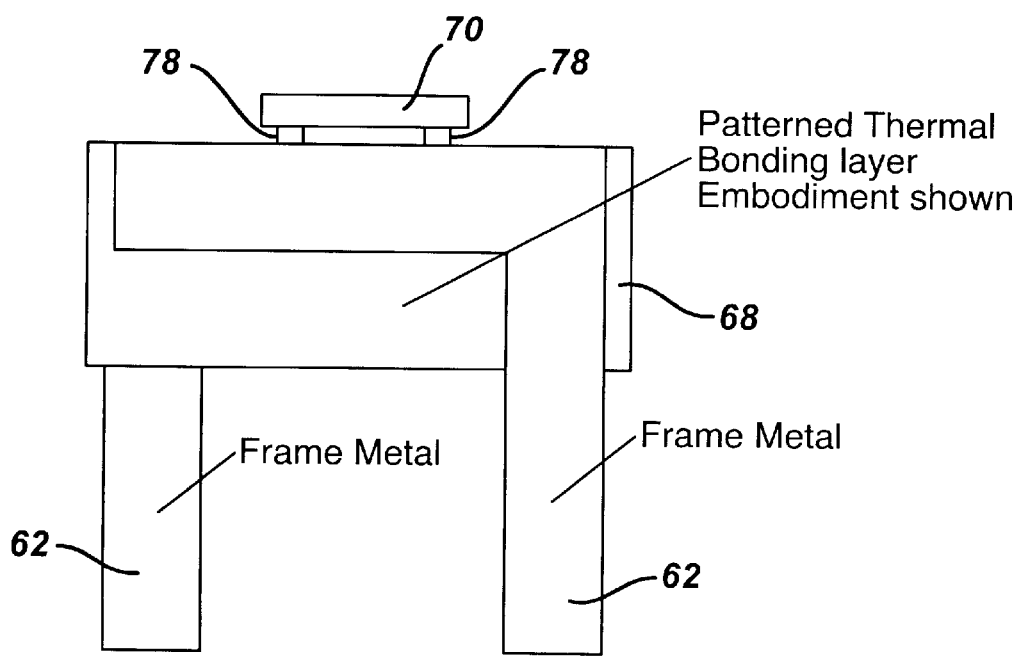
FIG. 14 illustrates a side view of a multi-layer flip chip frame structure, including an attached flip chip.

FIG. 13 illustrates a top view of the multi-layer flip chip frame structure of FIG. 10 with the flip chip 70 attached, including a polymer film insulator layer 64. The preferred flip chip 70 is disclosed in detail in copending application, Ser. No. 09/542,037, entitled "Flip Chip LED Apparatus," to Wojnarowski, Robert J., et al., FIG. 14 is a side view of a multi-layer flip chip frame structure 60, including the flip chip 70 attached. The embodiment of FIG. 14 includes a patterned thermally enhanced bonding layer 68 such as that shown in FIG. 12. Suitable examples of the patterned thermally-enhanced bonding layer 68 include thermally-enhanced KAPTON (DuPont), TEFLON (DuPont), or ULTEM (General Electric). The shape of the frame metal 62 is not critical and is selected based upon the desired application.

Figure 15:
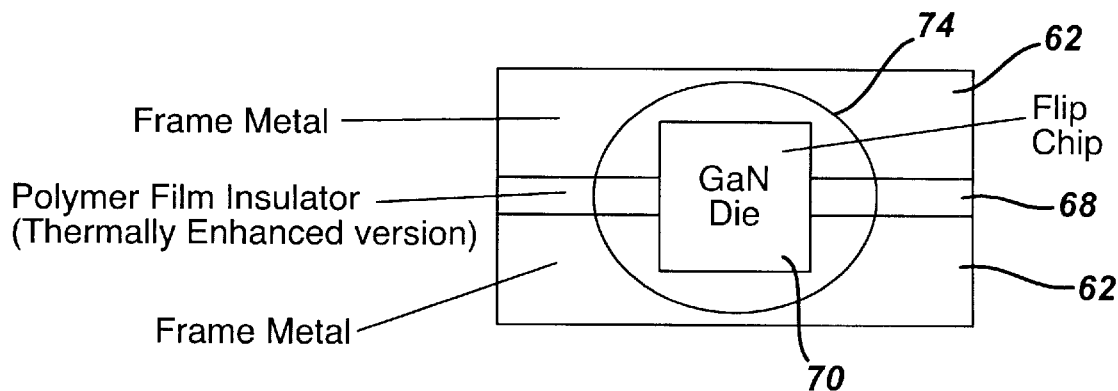
FIG. 15 illustrates a top plan view of a multi-layer flip chip frame structure into a cup geometric structure.

FIG. 15 is a top view of a multi-layer flip chip frame structure 60 with flip chip 70 attached, into a cup geometric structure 72 including a dimple 74. The dimple 74 is formed by an etching or punching process.

Figure 16:
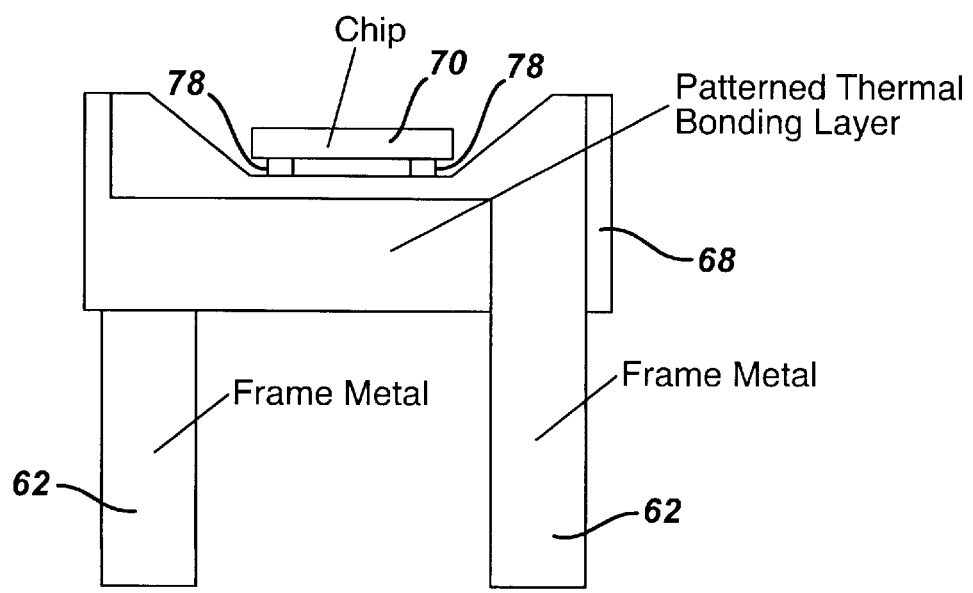
FIG. 16 illustrates a cutaway side view of a multi-layer flip chip frame structure.

FIG. 16 illustrates a cutaway side view of a multi-layer flip chip frame structure 60 with an attached micro BGA flip chip structure 70. This embodiment includes a patterned thermally enhanced bonding layer 68.

Figure 17:
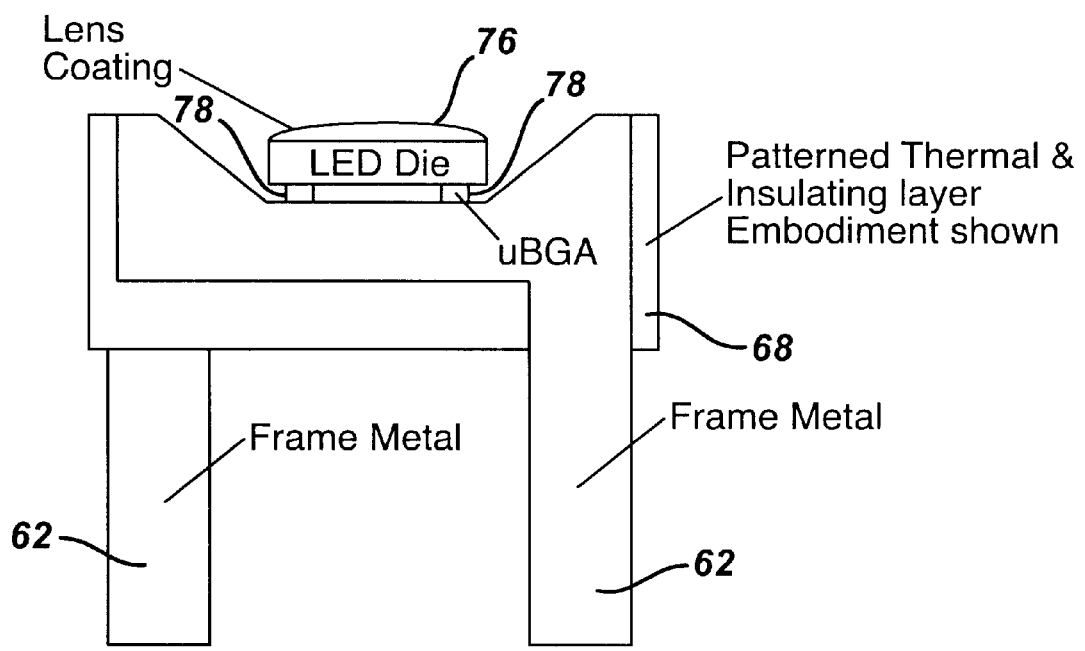
FIG. 17 illustrates a cutaway side view of a multi-layer flip chip frame structure.

FIG. 17 illustrates a cutaway side view of a multi-layer flip chip frame structure 60, including an attached micro BGA chip 70 and micro lens 76. The chip 70 also includes micro BGA 78. The preferred microlens 76 is disclosed in copending application, Ser. No. 09/542,037 entitled "Flip Chip LED Apparatus."

The invention has been described with reference to the preferred embodiment. Obviously, modifications and alterations will occur to others upon a reading and understanding of this specification. For example, other suitable thermally conducting, electrically insulating materials or ESD materials can be used without departing from the principles of the present invention. In addition, the basic principals of the invention are applicable to the packaging of semiconductors in general. The invention is intended to include all such modifications and alterations in so far as they come within the scope of the appended claims and the equivalents thereof.

What is claimed is:

1. A light-emitting semiconductor device packaging assembly comprising:
   a light-emitting semiconductor;
   input terminals connected to the light-emitting semiconductor for energizing the light-emitting semiconductor to emit light, said terminals having an electrically and thermally insulating gap therebetween wherein one of the input terminals provides primary heat sinking for the light-emitting semiconductor; and
   thermally conductive material forming a thermally conducting path in the assembly for transfer of thermal energy from the heat sinking terminal to another terminal when the light-emitting semiconductor is energized.

2. The packaging assembly of claim 1 wherein the thermally conductive material is arranged in the electrically and thermally insulating gap and forms the thermally conducting path across the electrically and thermally insulating gap.

3. The packaging assembly of claim 1 wherein the thermally conductive material is in the form of a mechanical support ring disposed around a portion of the input terminals.

4. The packaging assembly of claim 1 wherein the thermally conductive material is an epoxide.

5. The packaging assembly of claim 1 wherein the thermally conductive material is added in an amount that will not alter the fixed dimensions of the packaging.

6. The packaging assembly of claim 1 further comprising electrostatic discharge material arranged in the insulating gap or bridging the gap, the electrostatic discharge material providing voltage discharge protection for the light-emitting semiconductor.

7. The packaging assembly of claim 6 wherein the electrostatic discharge material is an MOV material.

8. The packaging assembly of claim 1 wherein the thermally conductive material is also capable of reducing electrostatic discharge.

9. The packaging assembly of claim 8 wherein the thermally conductive material is an MOV material.

10. The packaging assembly of claim 1 further comprising an encapsulant material disposed around the packaging assembly.

11. The packaging assembly of claim 10 wherein the encapsulant material is UV-resistant.

12. The packaging assembly of claim 10 wherein the encapsulant material is silicone.

13. A light-emitting semiconductor device packaging assembly comprising:

a light-emitting diode;

a lead frame comprising first and second leads connected to the light-emitting diode for energizing the light-emitting diode to emit light and for heat sinking the light-emitting diode; and thermally conductive material forming a thermally conductive path connecting the first and second leads for increasing the thermal conductance of the lead frame when the light emitting diode is energized.

14. The packaging assembly of claim 13 wherein the first and second leads are electrically isolated from each other so as to create a thermal gap between them.

15. The packaging assembly of claim 14 wherein the thermally conductive material is positioned in the thermal gap or encases the thermal gap.

16. The packaging assembly of claim 13 wherein the thermally conductive material is in the form of a mechanical support ring disposed around a portion of the input terminals.

17. The packaging assembly of claim 13 wherein the thermally conductive material is an epoxide.

18. The packaging assembly of claim 13 wherein the thermally conductive material is added in an amount that will not alter the fixed dimensions of the packaging.

19. The packaging assembly of claim 14 further comprising electrostatic discharge material positioned in the thermal gap.

20. The packaging assembly of claim 18 wherein the electrostatic discharge material is an MOV material.

21. The packaging assembly of claim 18 wherein the thermally conductive material is also capable of reducing electrostatic discharge.

22. The packaging assembly of claim 21 wherein the thermally conductive material is an MOV material.

23. The packaging assembly of claim 23 further comprising an encapsulant material disposed around the packaging assembly.

24. The packaging assembly of claim 22 wherein the encapsulant material is UV-resistant.

25. The packaging assembly of claim 23 wherein the encapsulant material is silicone.

26. The packaging assembly of claim 13 further comprising fluorescent or phosphorescent material disposed over the light-emitting diode.

27. The packaging assembly of claim 26 wherein the light-emitting diode produces light at predetermined wavelengths which is partially converted by the fluorescent or phosphorescent material into another wavelength to provide a white light.

28. The packaging assembly of claim 13 wherein the light-emitting diode is in a flip chip arrangement.

29. A semiconductor device package for use with a semiconductor device formed in a flip chip arrangement, the package assembly comprising:

a light-emitting semiconductor formed in a flip chip arrangement, the light-emitting semiconductor having a contact surface and one or more micro ball grid array structures attached thereto;

a lead frame connected to the one or more micro ball grid array structures, the lead frame including a plurality of electrically isolated metal layers for heat sinking the light-emitting semiconductor; and a thermally conductive material forming a thermally conductive path between frame metal layers in the assembly for conducting heat between said frame metal layers when the light-emitting semiconductor is energized.

30. The packaging assembly of claim 29 wherein the thermally conductive material is selected from the group consisting of polymer film insulator material, polymer glue insulator material, and thermally enhanced bonding material.

31. The packaging assembly as set forth in claim 13, wherein the first and second leads include:

a die attach lead having a receiving portion that receives the associated LED die and that has an electrical connection to the associated LED die via a first wire bond, the die attach lead defining a heat sink for heat sinking the associated LED die; and an isolated lead that has an electrical connection to the associated LED die via a second wire bond, the isolated lead arranged with respect to the die attach lead such that an electrically and thermally isolating gap exists therebetween that is bridged by the thermally conducting material which transfers heat from the die attach lead to the isolated lead.

\* \* \* \* \*